United States Patent
Skotnicki et al.

(10) Patent No.: US 7,297,578 B2
(45) Date of Patent: Nov. 20, 2007

(54) METHOD FOR PRODUCING A FIELD EFFECT TRANSISTOR

(75) Inventors: Thomas Skotnicki, Crolles (FR); Philippe Coronel, Barraux (FR); Joël Hartmann, Claix (FR)

(73) Assignee: STMicroelectronics S.A., Montrogue (FR)

( * ) Notice: Subject to any disclaimer, the term of this patent is extended or adjusted under 35 U.S.C. 154(b) by 232 days.

(21) Appl. No.: 10/943,242

(22) Filed: Sep. 16, 2004

(65) Prior Publication Data

US 2005/0085024 A1    Apr. 21, 2005

(51) Int. Cl.
*H01L 21/00* (2006.01)
*H01L 21/4763* (2006.01)
*H01L 21/302* (2006.01)

(52) U.S. Cl. ............... 438/157; 438/587; 438/745; 257/E21.412

(58) Field of Classification Search ............ 438/157, 438/587, 745; 257/E21.412
See application file for complete search history.

(56) References Cited

U.S. PATENT DOCUMENTS

| | | | | |
|---|---|---|---|---|
| 5,583,362 A | * | 12/1996 | Maegawa | ............... 257/347 |
| 5,753,557 A | * | 5/1998 | Tseng | ............... 438/303 |
| 5,811,324 A | * | 9/1998 | Yang | ............... 438/159 |
| 5,965,914 A | | 10/1999 | Miyamoto | |
| 6,495,403 B1 | * | 12/2002 | Skotnicki et al. | ........ 438/157 |
| 6,605,847 B2 | * | 8/2003 | Kim et al. | ........ 257/401 |
| 7,112,832 B2 | * | 9/2006 | Orlowski et al. | ........ 257/287 |
| 7,176,041 B2 | * | 2/2007 | Lee et al. | ........ 438/8 |
| 2003/0042547 A1 | | 3/2003 | Deleonibus | |
| 2004/0209463 A1 | * | 10/2004 | Kim et al. | ........ 438/666 |
| 2005/0048771 A1 | * | 3/2005 | Gao et al. | ........ 438/671 |

FOREIGN PATENT DOCUMENTS

EP    1 091 417    4/2001

OTHER PUBLICATIONS

Preliminary French Search Report, FR 0310984, May 17, 2004.

* cited by examiner

*Primary Examiner*—Michael Lebentritt
*Assistant Examiner*—Ron Pompey
(74) *Attorney, Agent, or Firm*—Gardere Wynne Sewell LLP

(57) ABSTRACT

A field effect transistor is produced on a substrate. A semiconductor material is deposited on a portion of a single crystal temporary material. At least part of the temporary material is removed. A portion of a conducting material is then formed above and beneath the portion of semiconductor material. A layer of an electrically insulating material is located between the portion of temporary material and the substrate.

36 Claims, 4 Drawing Sheets

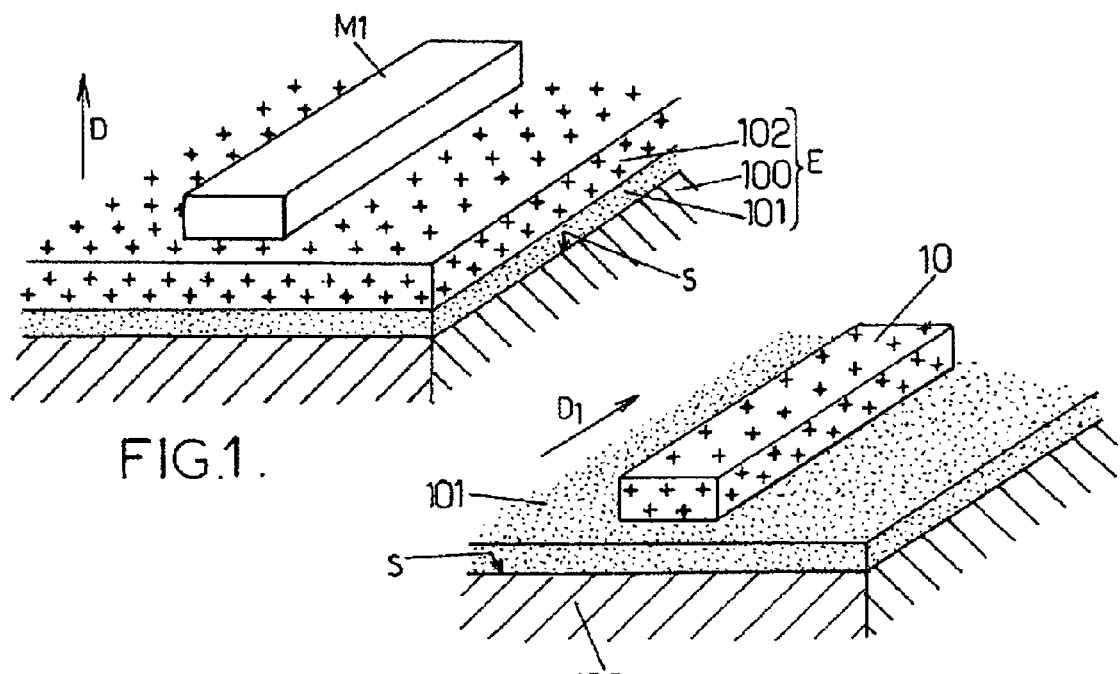
FIG.1.
FIG.2.
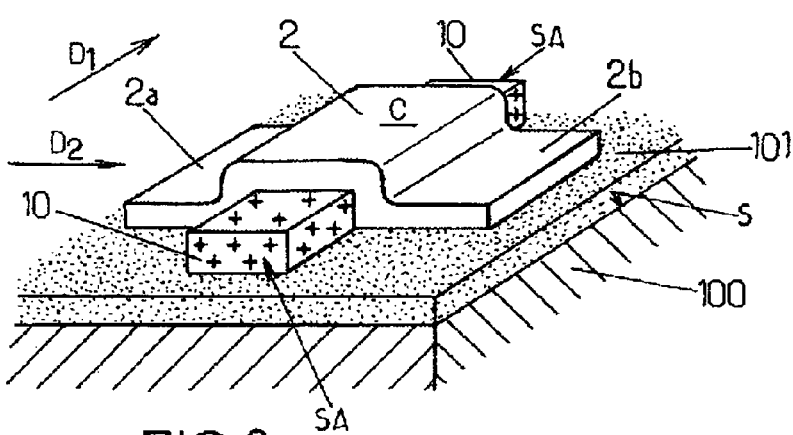
FIG.3.
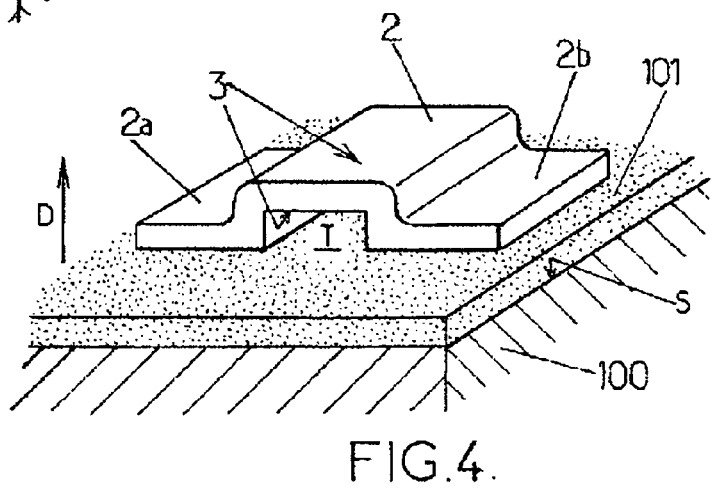
FIG.4.

METHOD FOR PRODUCING A FIELD EFFECT TRANSISTOR

PRIORITY CLAIM

The present application claims priority from French Application for Patent No. 03 10984 filed Sep. 18, 2003, the disclosure of which is hereby incorporated by reference.

BACKGROUND OF THE INVENTION

1. Technical Field of the Invention

The present invention relates to a method for producing a field effect transistor of the metal oxide semiconductor (MOS) type.

2. Description of Related Art

European Patent Application EP 1,091,417 (the disclosure of which is incorporated by reference), describes a configuration of GAA (Gate All Around) MOS transistor. Such a configuration allows the conduction state of the transistor to be well controlled thanks to better distribution of the electric field generated by the gate in the channel.

However, conduction control of a transistor having this configuration is limited by undesirable interactions between the substrate that carries the transistor and certain parts of the channel. These interactions, of electrostatic or electromagnetic type, may behave in a manner equivalent to that of parasitic transistors. This is because charges and electrical currents induced in the substrate near the channel in an uncontrolled manner are liable to have an effect on the conduction of the transistor, independently of a control signal applied to the gate of the transistor.

Moreover, such a gate all around transistor is produced using three lithography masks in succession. The first mask defines the active region of a transistor, within an electrically insulated circumference. The second mask defines a silicon portion corresponding to the source region, to the channel and to the drain region. The third mask defines the gate. The combination of these three masks with the usual design rules for producing integrated components results in a relatively large size of the transistor obtained.

A need exists for a method for producing a transistor with improved conduction control and having a size compatible with a high degree of integration.

SUMMARY OF THE INVENTION

An embodiment of the invention relates to a method for producing a field effect transistor. A portion of a substantially single crystal temporary material is formed above a surface of a conducting substrate with a layer of an electrically insulating material being located therebetween. A semiconductor material is deposited on the portion of temporary material, in the form of a portion having extensions approximately parallel to the surface of the substrate, on either side of the portion of temporary material, the portion of semiconductor material comprising a central part grown by epitaxy from the portion of temporary material. At least one access region is created for access to the portion of temporary material. At least part of the temporary material is then removed via the access region. An electrically insulating coating is then formed on exposed parts of the portion of semiconductor material. At least one portion of a conducting material is then formed above and beneath the central part of the portion of semiconductor material.

The portion of semiconductor material constitutes the conducting region of the transistor, that is to say the channel and at least parts of the source and of the drain, which are placed along the continuation of the channel at its ends. These source and drain parts correspond to the extensions of the portions of semiconductor material on each side of the portion of temporary material, parallel to the surface of the substrate. The conducting material placed above the central part of the portion of semiconductor material, and between said portion and the layer of insulating material, constitutes gate elements of the transistor.

In accordance with an embodiment of the invention, the layer of insulating material is present on top of the conducting substrate, before the formation of the portion of semiconductor material that constitutes the conducting region of the transistor. The transistor is thus at a certain distance from the substrate but corresponds to at least the thickness of this layer of insulating material. Consequently, electrical charges and currents present within the substrate have no effect on the conduction of the transistor. The conduction of the transistor then depends only on the electric field generated by a gate element or elements in the channel.

In accordance with an embodiment of the invention, the arrangement of gate elements on top of and beneath the channel allows for the conduction of the transistor to be controlled very precisely by means of electrical potentials applied to the gate elements.

Advantageously, the transistor produced in accordance with an embodiment of the invention is of small size, which consequently requires a smaller footprint on the substrate.

In accordance with an embodiment of the invention, peripheral electrical isolation of the transistor, with respect to adjacent electronic components placed on the surface of the substrate, is achieved only by leaving a space between the transistor and each of these components. The electrical isolation results from the presence of strips of the layer of insulating material that separates the transistor from the adjacent components. It is thus unnecessary to produce specific electrical isolation elements around the transistor, of the STI (Shallow Trench Isolation) or LOCOS (LOCal Oxidation of Silicon) for example. This results in a reduction in the cost of manufacturing circuits that incorporate transistors according to the invention.

According to an embodiment of the invention, the portion of semiconductor material formed above and beneath the central part of the portion of semiconductor material surrounds the central part of the portion of semiconductor material. A gate-all-around transistor is thus obtained, the conduction of which is controlled by a single electrical potential applied to the all around gate.

The process of forming a portion of a substantially single-crystal temporary material may comprise providing a conducting substrate covered with a layer of electrically insulating material, said layer of insulating material itself being covered with a layer of a substantially single crystal temporary material, and etching of the layer of temporary material outside a portion of the temporary material.

Advantageously, the conducting substrate covered by the layer of insulating material and the layer of temporary material is obtained commercially from a specialized manufacturer, and the transistor is produced from this composite substrate by an integrated circuit manufacturer by applying the processing step described above.

The process for forming at least one portion of the conducting material above and beneath the central part of the portion of semiconductor material may comprise depositing the conducting material above the portion of semiconductor material and between the portion of semiconductor material and the layer of insulating material, implanting specified atoms into the conducting material outside certain portions of the conducting material, the non-implanted portions of conducting material having projections corresponding substantially to the position that the portion of temporary material occupied above the surface of the substrate, and removing at least part of the implanted conducting material.

The extension of the gate elements of the transistor or of just its gate is thus limited to an area close to the channel. This limitation prevents unintentional electrical connections being formed subsequently during the production of an electronic circuit incorporating the transistor.

Advantageously, the portion of temporary material is defined by a lithography mask, and this mask is reused during implanting to define the non-implanted portions of conducting material. Such an operating method requires one less lithography mask, thereby helping to reduce the manufacturing cost of the transistor.

Furthermore, such an operating method prevents segments of the portion of semiconductor material existing between, on the one hand, the source or the drain and, on the other hand, the channel inserted between the gate elements or surrounded by the all-around gate. An even more compact transistor is thus obtained.

An embodiment of the invention also relates to a field-effect transistor placed above a conducting substrate, a layer of an electrically insulating material being located between at least one part of the transistor and the substrate, the transistor being produced according to a process as described above.

An embodiment of the invention also relates to a random access memory element comprising such a transistor.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 8 are perspective views of a transistor in the course of being produced, using a first method of implementing the present invention;

DETAILED DESCRIPTION OF THE DRAWINGS

Figure 5:
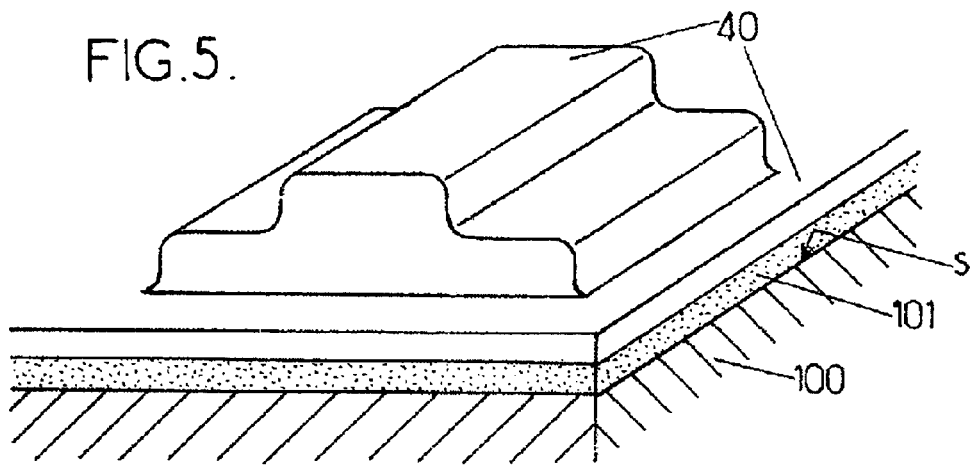

For the sake of clarity, the dimensions of the various transistor parts shown in these figures have not been drawn to scale. Identical references indicated on different figures correspond to identical elements or elements that have similar roles relative to the subject matter of the invention. The terms "upper", "lower", "on" and "under" used in the rest of the text are defined with reference to a direction D, indicated in FIG. 1, which is perpendicular to the surface of the substrate.

In FIG. 1, a substrate 100, for example based on silicon, is covered on a substantially planar upper surface S with a layer 101 of an electrically insulating material, for example made of silica $SiO_2$. The layer 101 has a thickness of greater than 10 nanometers in the direction D, so as to provide sufficient isolation of the final transistor with respect to electrical charges and currents flowing in the substrate 100. The layer 101 is itself covered with a layer 102 of a substantially single crystal material, which is chosen so as to be able to be removed selectively with respect to silicon. The material of the layer 102 may, for example, be a silicon germanium alloy containing about 26% germanium. In the first method of implementing the invention, described now, the assembly E formed by the substrate 100 and the layers 101 and 102 constitutes the initial support on which the transistor is produced. Such a support is commercially available.

A portion M1 of resist is formed on the layer 102, using one of the lithographic techniques known to those skilled in the art. A first lithography mask, for example a photolithography mask, is used to define the shape of the portion M1. The portion M1 corresponds substantially to the dimensions of the gate of the final transistor, parallel to the surface S.

The material of the layer 102 is then removed, outside that portion of the layer 102 that is protected by the resist portion M1. The removal may be carried out, for example, by exposing the layer 102 to a beam of particles accelerated parallel to the direction D, in the opposite sense thereto, and directed against the upper surface of the substrate 100 and of the transistor in the process of being produced. Such a removal process is called "dry etching". The configuration shown in FIG. 2 is obtained, in which an elongate portion 10 of the material of the layer 102 remains on the upper surface of the layer 101. D1 is the direction of the portion 10 parallel to the surface S.

A portion 2 of semiconductor material, for example silicon, is then formed on the layer 101 and on the portion 10. Several equivalent methods may be used to form the portion 2. A first method comprises depositing a resist (not shown) on the layer 101 and on the portion 10 outside both parts of said layer and of said portion that are intended to be covered by the portion 2, then in covering the whole assembly with silicon, and then in removing the resist with the silicon deposited on the latter. A second method comprises first depositing a conformal layer of silicon on the layer 101 and on the portion 10, in covering the part of this layer that corresponds to the portion 2 with a resist (not shown) and then in removing the silicon, by etching it, outside the portion 2. The resist used in one or other of the two methods of forming the portion 2 defines the dimensions of the conducting region of the transistor, parallel to the surface S. To do this, a second lithography mask is used in a manner known per se. For both methods, non-selective epitaxial silicon growth conditions are adopted when depositing the silicon. Thus, the silicon material deposited above the portion 10 is substantially single crystal silicon. It constitutes the channel of the final transistor. The silicon material of the portion 2 in contact with the layer 101 is polycrystalline. Optionally, the silicon material of the portion 2 may be doped at this stage of the process, so as to confer on it the desired semiconductor behavior.

According to FIG. 3, the portion 2 has a shape elongate in a direction D2 parallel to the surface S and substantially perpendicular to the direction D1. The portion 2 straddles the portion 10 in a central part C of the portion 2. It also possesses, on either side of the central part C, two extensions 2a and 2b in contact with the upper surface of the layer 101. The length of the portion C in the direction D2 is, for example, 2 microns. During formation of the portion 2, two parts of the surface of the portion 10 were exposed, at the ends of the portion 10 in the direction D1, so as to form two regions SA for access to the portion 10.

Next, the material of the portion 10 is removed via the regions SA, selectively with respect to the material of the portion 2. When the portion 10 is made of the silicon germanium alloy mentioned above and the portion 2 is made of silicon containing no germanium, the selective removal may be carried out by exposing the circuit being produced to a plasma that contains carbontetrafluoride ($CF_4$) molecules. Such a selective removal process is well known to those skilled in the art. The portion 10 is removed without impairing the portion 2. A tunnel T is thus formed under the central part C of the portion 2, at the position of the portion 10.

A layer of silica ($SiO_2$) is then formed on the exposed surfaces of the portion 2, by heating and exposing the latter to an oxidizing atmosphere. The layer thus formed constitutes an electrically insulating coating 3, which covers the portion 2 on its upper and lateral surfaces, and also in the tunnel T (FIG. 4). The coating 3 is intended to form the gate isolation layer of the final MOS transistor.

Next, as shown in FIG. 5, silicon 40 is deposited on the entire circuit. The silicon deposited completely fills the tunnel T and covers the portion 2 and the layer 101 with a layer of substantially uniform thickness.

Next, a resist portion M2 is formed by lithography above the silicon coating 40, in line with the position of the portion 10 along the direction D. The lithography mask that had been used to define the resist portion M1 (FIG. 1) is reused to define the portion M2.

Figure 6:
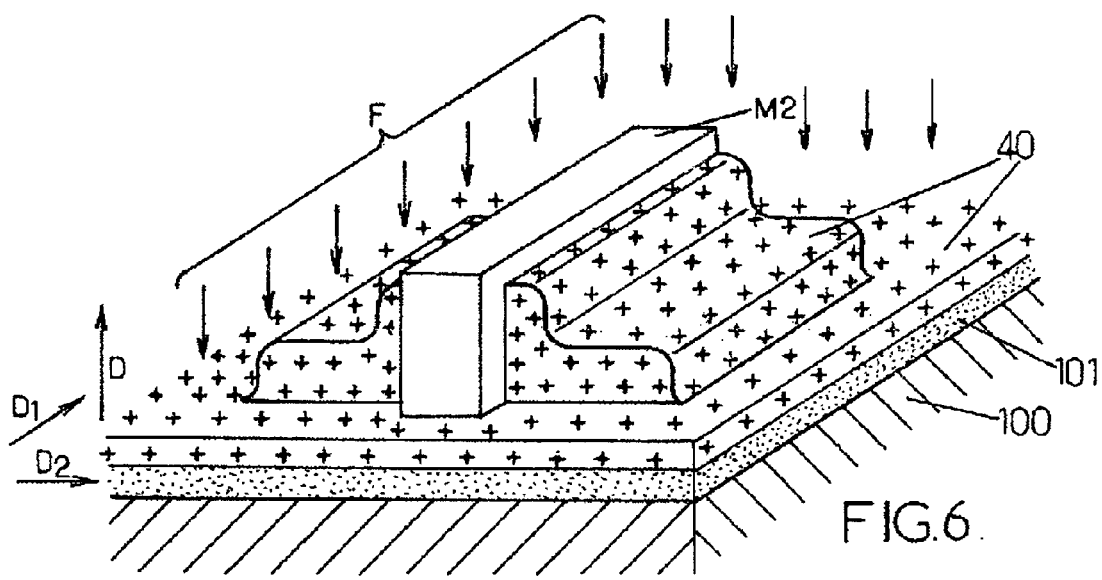
Figure 6A:
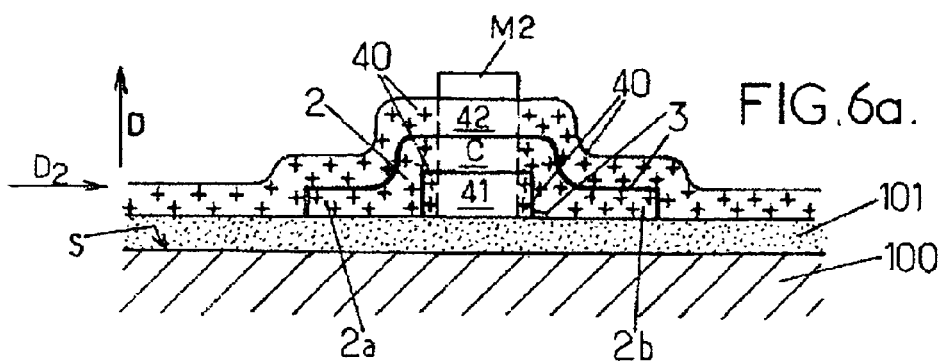
FIG. 6a is a sectional view of the transistor of FIGS. 1 to 8, corresponding to FIG. 6.

The substrate and the transistor being produced are exposed to a germanium implantation flux F (FIG. 6). Germanium atoms are implanted into the silicon 40, outside that part of the silicon protected by the portion M2. FIG. 6*a* is a sectional view in the direction D2, passing through the extensions 2*a* and 2*b* of the portion 2. It shows the various parts of the transistor that are germanium implanted: the portion 2 outside a part of the latter that corresponds approximately to the central part C and the silicon 40 outside two portions 41 and 42 that are located in line with the portion M2, in the direction D. The portions 41 and 42 are respectively located beneath and above the central part C of the portion 2.

The transistor is then heated to approximately 750° C. so as to form a silicon germanium alloy in the germanium implanted parts. Such heating causes partial crystallization of the alloy, this being favorable to the process for removing the alloy selectively with respect to the germanium free silicon material of the portions 41 and 42.

Figure 7:
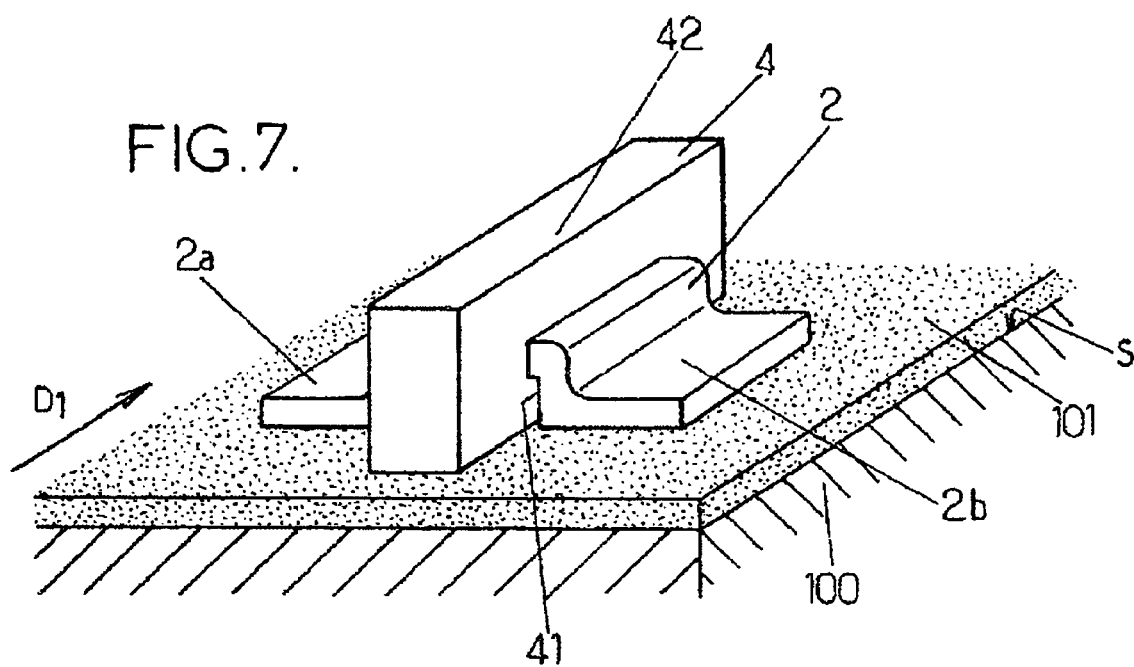

The silicon germanium alloy is then removed from the implanted parts that are exposed. A selective removal process similar to that mentioned above for removing the portion 10 may be used. The configuration shown in FIG. 7 is thus obtained. Thanks to the encapsulation of the portion 2 that the coating 3 constitutes, the portion 2 is not impaired. After the removal, the two portions 41 and 42 are connected together at their opposed ends in the direction D1 and form a single portion 4 that surrounds the central part C of the portion 2. By proceeding in the manner described above, the portions 4 and 10 have respective projections on the surface S, in the direction D, which are substantially of the same shape.

According to a variant of the invention, the portions 41 and 42 have respective widths in the direction D2 that are smaller than the width of the portion 10 in the direction D2. Such a reduction in the widths of the portions 41 and 42 may be obtained in various ways. A first way consists in varying the direction of exposure of the resist that constitutes the portion M2 relative to the sensitization beam used during the lithography process carried out in order to form this portion. Equivalently, it is possible to use a resist sensitization beam that converges towards the substrate 100. Another way consists, during the implantation, in varying the direction of the implantation flux F about the direction D. Yet another way consists in gently heating the resist portion M2 so as to cause the resist to creep in the direction of shrinkage of the latter in the direction D2. Such a variant whereby the portions 41 and 42 have reduced widths is particularly advantageous, especially for producing subsequent connections for connecting the transistor.

The resist portion M2 is removed.

Figure 8:
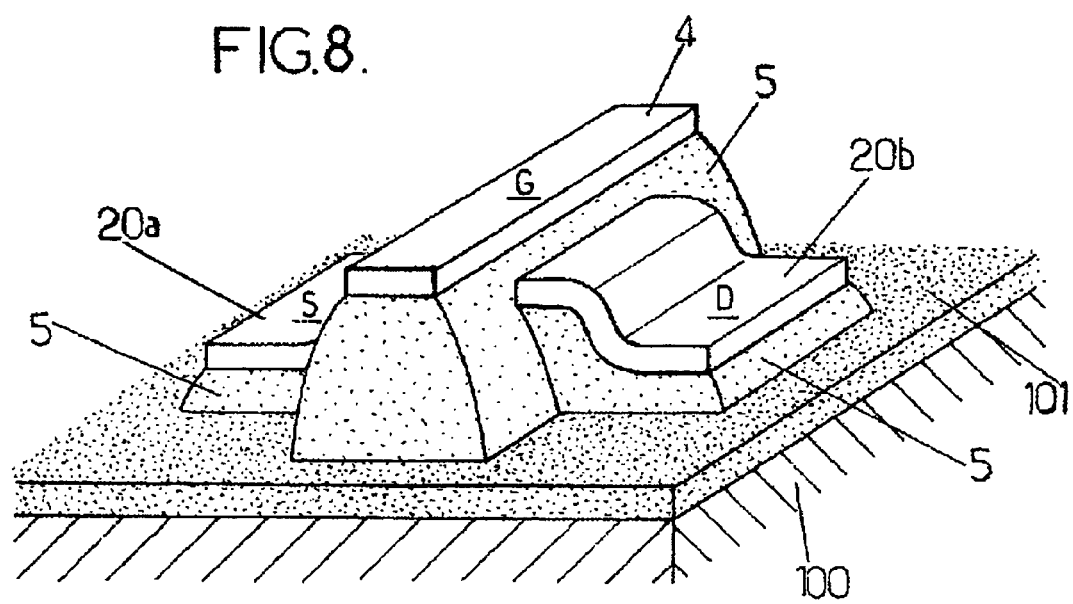
Figure 9:
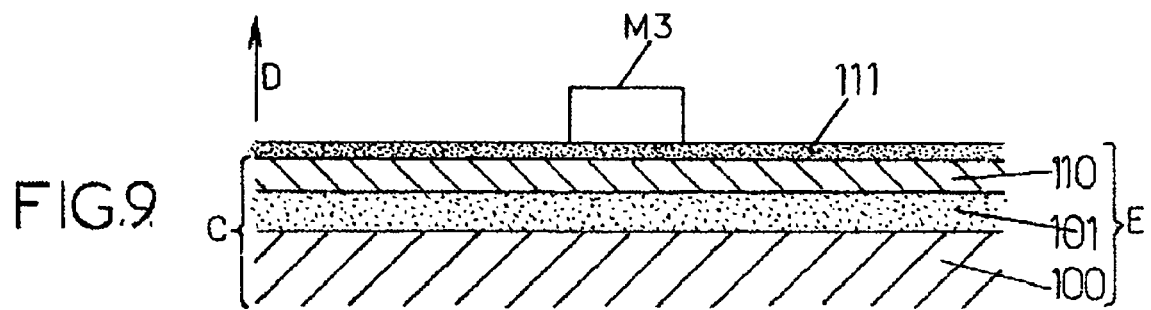
FIGS. 9 to 12 are sectional views of a transistor in the course of being produced, using a second method of implementing the present invention.

Next, a spacer 5 (FIG. 8) is produced in a manner known to those skilled in the art. A continuous layer of insulating material, for example silicon nitride ($Si_3N_4$), is deposited on the exposed parts of the portions 2 and 4 and of the layer 101. This layer is then etched by a plasma, the particles of which are accelerated along the direction D, but in the opposite sense thereof, and directed against the silicon nitride layer. The upper surfaces of the portions 2 and 4 are thus again exposed, whereas the lateral surfaces of the portions 2 and 4 remain covered with insulating material.

Finally, the extensions 2*a* and 2*b* of the portion 2 may be thickened along the direction D, by depositing additional silicon portions 20*a* and 20*b*, on each of the extensions 2*a* and 2*b* respectively. Suitable deposition conditions are adopted so as to form additional silicon material only on the exposed silicon surfaces. Optionally, the upper part of the portion 4 is thickened at the same time. The portion 20*a* therefore constitutes the electrical contact region for the source, denoted by S in FIG. 8, and the portion 20*b* constitutes the electrical contact region for the drain, denoted by D. The upper surface of the portion 4 constitutes the electrical contact region for the gate, denoted by G. Part of the material of each contact region S, D and G may be converted, in a known manner, into a metal silicide in order to reduce the electrical contact resistance between each portion of the transistor and an electrical connection that connects this portion.

By reducing the width of the portions 41 and 42 it is possible to obtain connections that connect the transistor without a short circuit, despite any possible misalignment of these connections relative to the gate G.

A second method of implementing the invention will now be described in conjunction with FIGS. 9 to 12. According to this method of implementation, the initial support E on which the transistor is produced comprises a silicon substrate 100 covered with a silica layer 101, which is itself covered with a layer 110 of substantially single crystal silicon. The layer 101 may be obtained by thermal oxidation of the material of the substrate 100. In this case it is particularly dense. It preferably has a thickness greater than 10 nanometers so as to obtain good isolation of the final transistor relative to the substrate 100. Such a support, given by way of example, is commercially available at the present time.

A layer 111 of silica ($SiO_2$) is formed on the layer 110, for example using a LPCVD (Low Pressure Chemical Vapor Deposition) process. Molecules of the tetraethoxysilane (TEOS) type may be used as precursors. The layer 111 has, for example, a thickness of 20 nanometers.

Next, a resist portion M3 is formed on the layer 111 (FIG. 9), the dimensions of which correspond to those of the portion M1 of the first method of implementing the invention. The portion M3 likewise defines the dimensions of the gate of the final transistor obtained, parallel to the surface S.

Figure 10:
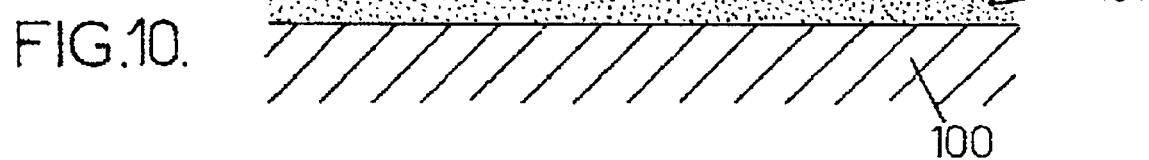

The layers 111 and 110 are then etched in succession, outside the parts of these layers that are located in line with the portion M3, in the direction D. A stack of the portions coming from the layers 110 and 111 then remains above the layer 101. A spacer 112, for example made of silicon nitride ($Si_3N_4$), is produced around this stack, in a manner similar to that described above in relation to FIG. 8. The configuration shown in FIG. 10 is obtained.

The remaining part of the silica layer 111 is then removed, for example by wet etching. Conditions for the selective etching of the silica material of the layer 111 relative to the silica material of the layer 101 are then adopted so as to remove the remaining part of the layer 111 without substantially removing material from the layer 101. Such conditions result, for example, from a density difference between the layers 101 and 111 that is due to their respective methods of production. Thus, a removal rate in the direction D of the layer 111 may be obtained, which is approximately 1000 times higher than the rate of removal of the layer 101, when the two layers are exposed to the same etching solution. The upper surface of the remaining part of the layer 110 is thus exposed.

Figure 11:
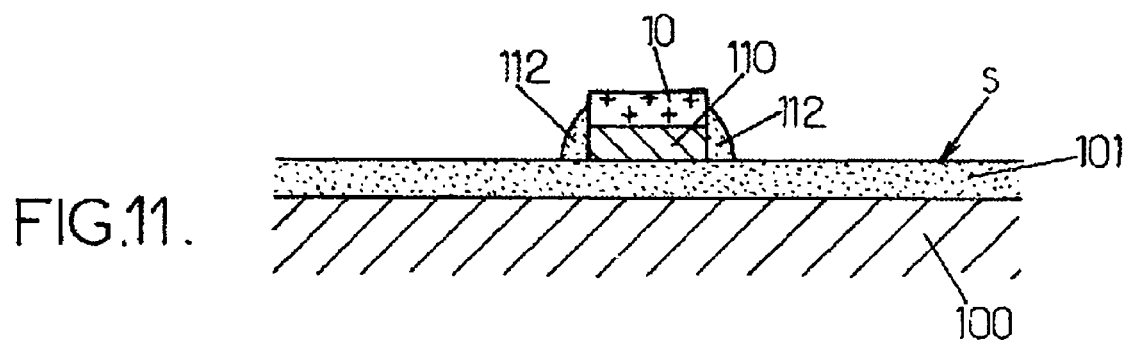

A silicon germanium alloy is then grown by selective epitaxy from the upper surface of the remaining part of the layer 110. This epitaxial growth is possible thanks to the single crystal structure of the initial layer 110. Owing to the selectivity of the alloy growth conditions adopted, an alloy portion 10 bounded by the spacer 112, parallel to the surface S, is obtained (FIG. 11). The thickness of the portion 10 is, for example, 20 nanometers.

Figure 12:
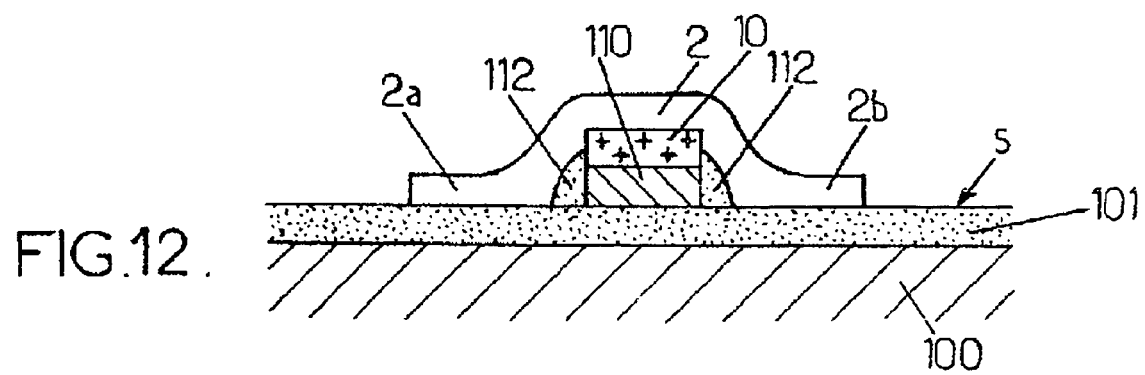

The process for producing the transistor is then continued in a manner identical to that described in the case of the first method of implementing the invention. In particular, FIG. 12 shows the configuration obtained after formation of the portion 2 that constitutes the conducting region of the transistor. The portion 2 is still made of substantially single crystal material in its central part. The residual part of the layer 110 and the spacer 112 then remain between the transistor and the insulating layer 101, without disturbing the operation of the transistor.

Transistors obtained according to one of the methods of implementing the invention that have been described above are particularly appropriate for forming random access memory (RAM) elements, especially those of the static random access memory (SRAM) type. Apart from the size reduction of the memory element mentioned above, such a memory element has a particularly low electrical consumption owing to the presence of the insulating layer 101 beneath the transistors. Moreover, the gate all around (GAA) configuration of the gate 4 around the channel improves the reliability of the memory element. It also allows the memory element to operate at a higher rate than that of the memory elements whose transistors have a simple upper gate.

It will be apparent to those with ordinary skill in the art that the foregoing is merely illustrative and not intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. A method for producing a field effect transistor, comprising:
   a) forming a portion of a substantially single crystal temporary material above a surface of a conducting substrate with a layer of an electrically insulating material being located between the portion of temporary material and the substrate;
   b) depositing a semiconductor material on the portion of temporary material to form in a single depositing step a continuous structure including a central part connected to two opposed extensions approximately parallel to the surface of the substrate, wherein the extensions are located on either side of the portion of temporary material, the central part of the semiconductor material being substantially single crystal grown in situ by epitaxy from the portion of substantially single crystal temporary material;
   c) creating at least one access region for access to the portion of temporary material;
   d) removing at least part of the temporary material via the access region;
   e) forming an electrically insulating coating on exposed parts of the deposited semiconductor material; and
   f) forming at least one portion of a conducting material above and beneath the central part of the deposited semiconductor material.

2. The method according to claim 1, wherein the portion of conducting material formed during step f) surrounds the central part of the semiconductor material.

3. The method according to claim 1, wherein a) forming comprises:
   a1) providing a conducting substrate covered with a layer of electrically insulating material, said layer of insulating material itself being covered with a layer of a substantially single crystal temporary material; and
   a2) etching of the layer of temporary material outside a portion of the temporary material.

4. The method according to claim 1, wherein the portion of temporary material and the portion of conducting material have projections of substantially the same shape on the surface of the substrate.

5. The method according to claim 1, wherein the temporary material is based on a silicon-germanium alloy and wherein the semiconductor material is based on silicon.

6. A method for producing a field effect transistor, comprising:
   a) forming a portion of a substantially single crystal temporary material above a surface of a conducting substrate with a layer of an electrically insulating material being located between the portion of temporary material and the substrate;
   b) depositing a semiconductor material on the portion of temporary material, in the form of a portion having extensions approximately parallel to the surface of the substrate, on either side of the portion of temporary material, the portion of semiconductor material comprising a central part grown by epitaxy from the portion of temporary material;
   c) creating at least one access region for access to the portion of temporary material;
   d) removing at least part of the temporary material via the access region;
   e) forming an electrically insulating coating on exposed parts of the portion of semiconductor material; and
   f) forming at least one portion of a conducting material above and beneath the central part of the portion of semiconductor material, wherein f) forming comprises;
      f1) depositing the conducting material above the portion of semiconductor material and between the portion of semiconductor material and the layer of insulating material;

f2) implanting specified atoms into the conducting material outside certain portions of the conducting material, the non-implanted portions of conducting material having projections corresponding substantially to the position that the portion of temporary material occupied above The surface of the substrate; and f3) removing at least part of the implanted conducting material.

7. The method according to claim 6, wherein the portion of temporary material is defined during a) forming by a lithography mask and wherein the non-implanted portions of conducting material are defined during f2) implanting using the same lithography mask.

8. The method according to claim 7 wherein the non-implanted portions of conducting material have smaller respective widths than a corresponding width of the portion of temporary material, said widths being measured parallel to a direction of the two extensions of the portion of semiconductor material.

9. The method according to claim 6, wherein the conducting material is based on silicon and wherein said specified atoms are germanium atoms.

10. The method according to claim 1, wherein the layer of insulating material has a thickness of greater than 10 nanometers in the direction perpendicular to the surface of the substrate.

11. A method for fabricating a field effect transistor structure, comprising:
  forming a temporary structure over an insulating layer;
  forming a semiconductive strip saddling over the temporary structure;
  removing the temporary structure to define a tunnel under the semiconductive strip;
  depositing silicon to fill the tunnel and cover the semiconductive strip, the silicon having a central portion and opposed end portions;
  selectively implanting atoms into the deposited silicon opposed end portions; and
  removing the deposited silicon which has been selectively implanted to leave the deposited silicon filling the tunnel and the deposited silicon in the central portion overlying the semiconductive strip.

12. The method of claim 11 further comprising connecting the deposited silicon filling the tunnel and the deposited silicon in the central portion overlying the semiconductive strip together.

13. The method of claim 12 wherein the connecting is made at opposed ends thereof.

14. The method of claim 11 further including:
  heating so as to partially crystallize the deposited silicon which has been selectively implanted.

15. The method of claim 11 further including forming a lateral spacers of insulating material.

16. The method of claim 11 further including thickening the saddling semiconductive strip at locations away from the central portion.

17. The method of claim 16 wherein the locations away from the central portion comprise drain and source regions of the transistor.

18. The method of claim 17 further comprising siliciding the drain and source regions.

19. A method for fabricating a field effect transistor structure, comprising:
  forming a strip over an insulating layer comprising a substantially single crystal silicon layer and an overlying insulating layer;
  forming lateral spacers an sides of the strip;
  removing the overlying insulating layer from the strip;
  epitaxially growing a silicon-based alloy on the substantially single crystal silicon layer of the strip;
  forming a semiconductive strip saddling over the strip;
  removing the silicon-based alloy to define a tunnel under the semiconductive strip;
  depositing silicon to fill the tunnel and cover the semiconductive strip, the silicon having a central portion and opposed end portions;
  selectively implanting atoms into the deposited silicon opposed end portions; and
  removing the deposited silicon which has been selectively implanted to leave the deposited silicon filling the tunnel and the deposited silicon in the central portion overlying the semiconductive strip.

20. The method of claim 19 further comprising connecting the deposited silicon filling the tunnel and the deposited silicon in the central portion overlying the semiconductive strip together.

21. The method of claim 20 wherein the connecting is made at opposed ends thereof.

22. The method of claim 19 further including thickening the saddling semiconductive strip at locations away from the central portion.

23. The method of claim 22 wherein the locations away from the central portion comprise drain and source regions of the transistor.

24. The method of claim 23 further comprising siliciding the drain and source regions.

25. A method for producing a field effect transistor structure, comprising:
  depositing a semiconductor material over a portion of a single crystal temporary material so as to produce in a single depositing step a continuous strip of material comprising a central single crystal part grown in situ by epitaxy from the portion of the single crystal temporary material and opposed extension parts extending on either side from the central single crystal part;
  removing at least part of the temporary material to form a tunnel; and
  forming a conducting material in the tunnel and above at least the central single crystal part of the semiconductor material.

26. The method of claim 25 further including forming an electrically insulating material between the portion of the single crystal temporary material and a supporting substrate.

27. The method of claim 25 wherein the conducting material in the tunnel and above the semiconductor material forms a gate-all-around structure for the transistor.

28. The method of claim 27 wherein the deposited semiconductor material includes a center portion at the tunnel forming a channel for the transistor and opposed portions away from the center portion forming drain and source regions, respectively, for the transistor.

29. A method for producing a field effect transistor structure, comprising:
  forming a substantially single crystal temporary material strip above a surface of a conducting substrate;
  depositing a semiconductor material layer over a portion of temporary material strip to form in a single depositing step a continuous layer of material comprising a center substantially single crystal portion epitaxially grown in situ from and overlying the strip and opposed end portions extending on either side away from the center portion;

removing the temporary material strip underneath the semiconductor material layer;

forming a conducting material in above and beneath the center portion of the semiconductor material layer.

30. The method of claim 29 further comprising forming an electrically insulating coating on exposed parts of the portion of semiconductor material after removing the temporary material strip.

31. The method of claim 29 wherein the conducting material above and beneath the center portion of the semiconductor material layer forms a gate-all-around structure for the transistor.

32. The method of claim 31 wherein the center portion of the deposited semiconductor material forms a channel for the transistor and opposed portions away from the center portion form drain and source regions, respectively, for the transistor.

33. The method of claim 29 further including forming lateral spacers about the conducting material.

34. The method according to claim 1, wherein the extensions on either side of the portion of temporary material of the semiconductor material deposited in step b are polycrystalline source/drain regions of the transistor and the central single crystal part is a channel region of the transistor.

35. The method of claim 25, wherein the opposed extension parts of the deposited semiconductor material are polycrystalline source/drain regions of the transistor structure and the central single crystal part is a channel region of the transistor structure.

36. The method of claim 29, wherein the opposed end portions of the deposited semiconductor material layer are polycrystalline source/drain regions of the transistor structure and the center substantially single crystal portion is a channel region of the transistor structure.

* * * * *

UNITED STATES PATENT AND TRADEMARK OFFICE
CERTIFICATE OF CORRECTION

| | | |
|---|---|---|
| PATENT NO. | : 7,297,578 B2 | Page 1 of 1 |
| APPLICATION NO. | : 10/943242 | |
| DATED | : November 20, 2007 | |
| INVENTOR(S) | : Thomas Skotnicki et al. | |

It is certified that error appears in the above-identified patent and that said Letters Patent is hereby corrected as shown below:

In the Claims:

At column 9, claim number 6, line number 6, please replace the word [The] with the word -- the --.

At column 10, claim number 19, line number 1, please replace the word [an] with the word -- on --.

Signed and Sealed this
Thirtieth Day of August, 2011

David J. Kappos
*Director of the United States Patent and Trademark Office*